(12) United States Patent
Bucella et al.

(10) Patent No.: US 10,500,972 B2
(45) Date of Patent: Dec. 10, 2019

(54) METHOD AND APPARATUS TO DISSIPATE RECOVERED ENERGY FROM A MECHANICAL LOAD WITHIN A CONNECTED MOTOR DURING BRAKING

(71) Applicant: Teknic, Inc., Pittsford, NY (US)

(72) Inventors: Thomas John Bucella, Rochester, NY (US); Scott Mayne, Webster, NY (US); Warren God, Fairport, NY (US)

(*) Notice: Subject to any disclaimer, the term of this patent is extended or adjusted under 35 U.S.C. 154(b) by 0 days.

(21) Appl. No.: 15/916,751

(22) Filed: Mar. 9, 2018

(65) Prior Publication Data

US 2018/0257511 A1 Sep. 13, 2018

Related U.S. Application Data

(60) Provisional application No. 62/469,238, filed on Mar. 9, 2017.

(51) Int. Cl.
*H02P 3/14* (2006.01)
*B60L 15/20* (2006.01)
(Continued)

(52) U.S. Cl.
CPC ............ *B60L 15/2009* (2013.01); *B60L 7/16* (2013.01); *H02J 3/1892* (2013.01); *H02J 7/0029* (2013.01); *H02J 7/0047* (2013.01); *H02J 7/14* (2013.01); *H02K 1/146* (2013.01); *H02K 1/276* (2013.01); *H02K 49/104* (2013.01); *H02P 3/18* (2013.01); *H02P 6/18* (2013.01); *H02P 6/24* (2013.01); *H02P 25/026* (2013.01);
(Continued)

(58) Field of Classification Search
CPC ......... H02P 21/24; H02P 6/10; G01R 31/343; G01R 31/12
See application file for complete search history.

(56) References Cited

U.S. PATENT DOCUMENTS 6,768,284 B2 * 7/2004 Lee ..................... H02M 7/797
318/808
7,256,701 B2 * 8/2007 Kono .................... B60L 3/0023
324/551

(Continued)

OTHER PUBLICATIONS

Csanyi, E. "Two Basic Methods Used for Braking a Motor (DC Injection and Dynamic)", retrieved from http://electrical-engineering-portal.com/methods-braking-motor; as early as Apr. 2016.
(Continued)

*Primary Examiner* — Rina I Duda
(74) *Attorney, Agent, or Firm* — Stanzione & Associates, PLLC; Patrick Stanzione (57) ABSTRACT

In a permanent magnet synchronous motor drive system, phase currents can be used to calculate a current that produces no shaft torque and only motor losses and a current that only produces shaft torque. These currents can be controlled to be resupplied into the motor drive system to a desired amount on a continuous basis to maintain a DC energy storage device voltage at a desired safe level. The calculated currents are resupplied to the motor drive system such that voltage levels within the DC energy storage device that approach a voltage maximum limit are transferred to the motor in the form of current that is dissipated by the motor without losing efficiency and control of driving a load with the motor.

24 Claims, 10 Drawing Sheets

(51) Int. Cl.

| | |
|---|---|
| *B60L 7/16* | (2006.01) |
| *H02P 25/026* | (2016.01) |
| *H02P 6/24* | (2006.01) |
| *H02K 49/10* | (2006.01) |
| *H02J 3/18* | (2006.01) |
| *H02P 6/18* | (2016.01) |
| *H03B 5/12* | (2006.01) |
| *H02J 7/00* | (2006.01) |
| *H02J 7/14* | (2006.01) |
| *H02K 1/14* | (2006.01) |
| *H02K 1/27* | (2006.01) |
| *H02P 3/18* | (2006.01) |
| *H02P 25/03* | (2016.01) |
| *B60L 15/02* | (2006.01) |
| *B60L 1/00* | (2006.01) |
| *B60L 7/22* | (2006.01) |

(52) U.S. Cl.
CPC ........... *H02P 25/03* (2016.02); *H03B 5/1265* (2013.01); *B60L 1/20* (2013.01); *B60L 7/22* (2013.01); *B60L 15/025* (2013.01); *B60L 2210/40* (2013.01); *H02P 3/14* (2013.01); *Y02T 10/7258* (2013.01)

(56) References Cited

U.S. PATENT DOCUMENTS

| | | | |
|---|---|---|---|
| 7,602,139 B2* | 10/2009 | Ho | H02P 6/185 318/400.02 |
| 7,650,968 B2* | 1/2010 | Oesterle | B66B 5/021 187/290 |
| 8,981,686 B2* | 3/2015 | Becerra | H02P 21/24 318/400.02 |
| 2012/0256580 A1* | 10/2012 | Yu | H02P 29/032 318/779 |
| 2015/0349681 A1* | 12/2015 | Liu | H02P 27/06 318/400.21 |

OTHER PUBLICATIONS

"Braking methods in Induction motors", retrieved from https://www.electrotechnik.net/2015/06/braking-methods-in-induction-motors.html; Jun. 2015.
Bartos, F. "DC-injection lets motors do the braking", retrieved from http://www.controleng.com/single-article/dc-injection-lets-motors-do-the-braking; Apr. 2006.
"DC injection braking—Wikipedia", retrieved from https://en.wikipedia.org/wiki/DC_injection_braking; as early as Jul. 2011.
Akin et al. "Sensorless Field Oriented Control of 3-Phase Permanent Magnet Synchronous Motors", Texas Instruments; Mar. 2011.

* cited by examiner

METHOD AND APPARATUS TO DISSIPATE RECOVERED ENERGY FROM A MECHANICAL LOAD WITHIN A CONNECTED MOTOR DURING BRAKING

REFERENCE TO RELATED APPLICATIONS

This application claims one or more inventions which were disclosed in Provisional Application No. 62/469,238 filed Mar. 9, 2017, entitled Method and Apparatus to Dissipate Recovered Energy From A Mechanical Load Through A Motor During Braking. The benefit under 35 USC § 119(e) of the United States provisional application is hereby claimed, and the aforementioned application is hereby incorporated herein by reference in its entirety.

BACKGROUND OF THE INVENTION

Field of the Invention

The present inventive concept pertains to the field of motor control systems to perform a sporadic or periodic braking function where energy is dissipated from the load. More specifically, the present inventive concept pertains to the field of motor control systems to perform a sporadic or periodic braking function where energy is dissipated from the load in a manner to protect a capacitor bank.

Description of Related Art

In automated mechatronic systems motors are sometimes called upon to perform a sporadic or periodic braking function where energy flows from a load into a motor, for example, when decelerating connected loads, lowering connected loads (e.g., an elevator), retracting a load away from a compressed spring, or other similar situations. When motors are driven by electronic means as in a servo drive, a variable speed drive, or a stepper motor drive, this energy is referred to as regenerated energy. The regenerated energy is returned to electronic motor inverter circuitry and then efficiently transferred to a DC voltage bus within the motor drive circuit. In applications that are powered by an AC (alternating current) line the regenerated energy is typically returned to a capacitor bank. The energy stored in a capacitor is equal to ½ CV² (C=capacitance; V=voltage). Accordingly, as the energy in the capacitor bank increases so does the voltage across the capacitor bank. Up to a certain level, this is a helpful effect as this energy stored in the capacitor bank is then used to power the motor during subsequent motoring cycles (where the energy flows from the motor to the load).

Capacitor banks employed by electronic motor drives have energy storage limitations. For example, above some level of energy, indicated by the voltage across the capacitor bank, the capacitors will fail, often with disastrous consequences such as explosion of the capacitor bank, and sometimes destruction of electrical components connected thereto. There may be other limitations on the voltage across the capacitor bank as other parts of the motor drive circuits may alternately fail. Hence, the voltage across the capacitor bank must be kept below a certain limit to maintain proper operation of the motor drive. Each type of capacitor bank will have its own voltage limit depending on several factors with respect to the capacitor bank.

Three basic methods are currently employed in AC line motor drive systems to limit the voltage across the capacitor bank. The first method to limit the voltage across the capacitor bank is to modify the motion within the mechatronic system to limit the amount of energy returned to the capacitor bank, keeping the capacitor bank's voltage below a certain limit. This method is sometimes useful, but often can't be employed because doing so compromises the performance of such a mechatronic system, such as modifying the motion of the motor.

Figure 1:
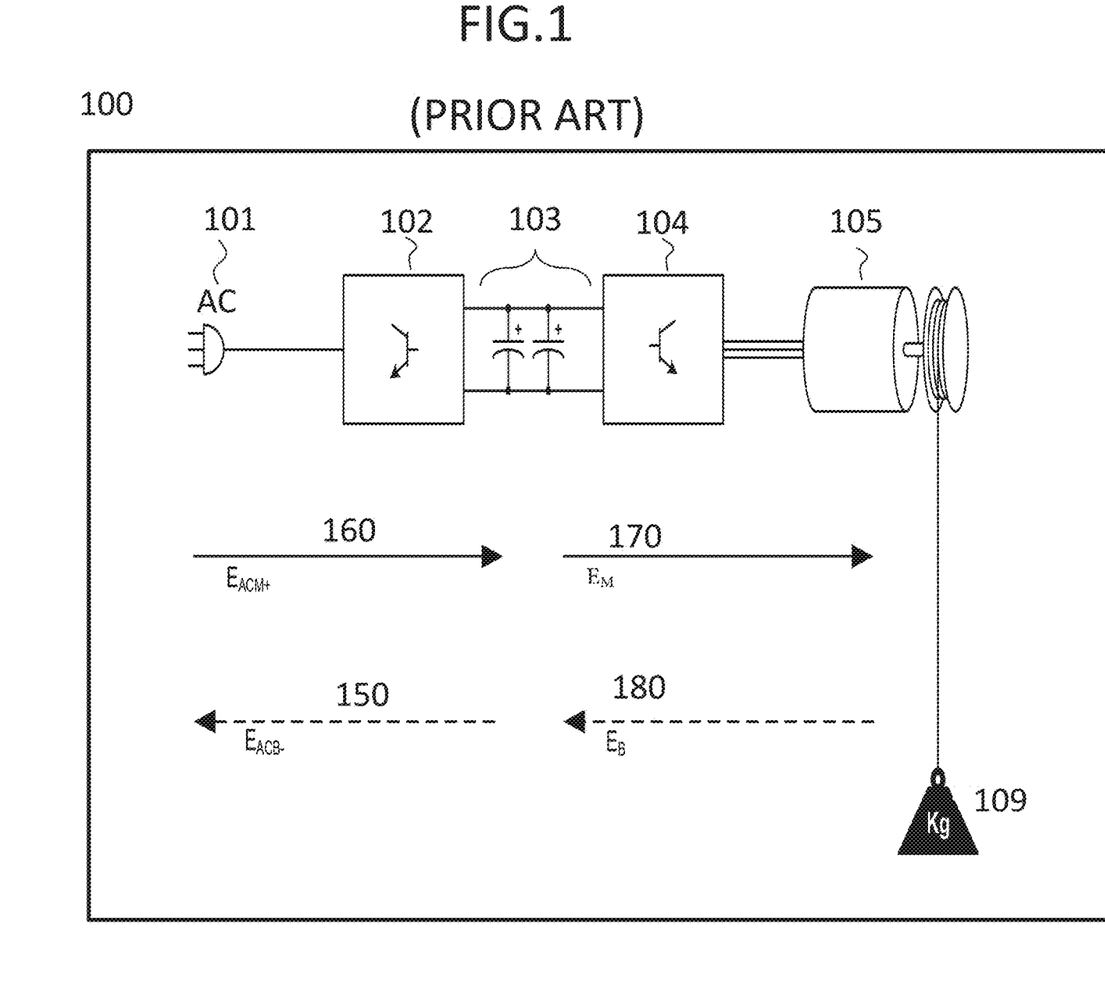
FIG. 1 illustrates a conventional AC line motor drive circuit that limits voltage across a capacitor bank that includes a bi-directional rectifier.

The second method is illustrated in FIG. 1, which illustrates a motor drive system (100). Here the method to limit the voltage across a capacitor bank (103) is to return stored energy to an AC power line (101) via a bi-directional rectifier (102). More specifically, the bi-directional rectifier (102) fills the capacitor bank (103) with energy from the AC line (101) when motoring, e.g., raising a load (109) with a motor (105) (see $E_{ACM+}$ energy flow arrow 160). Next, energy from the capacitor bank (103) flows to the motor (105) through an inverter (104) while motoring (raising the load 109) drains bus capacitors of the capacitor bank (103) (see $E_M$ energy flow arrow 170). Then when the motor (105) is braking, e.g., lowering the load (109), the energy first fills the bus capacitors in the capacitor bank (103) (see $E_B$ energy flow arrow 180) and then the energy in the bus capacitors flows back into the AC line (101) (see $E_{ACM-}$ energy flow arrow 150). In most systems this is far from economically feasible as the average power (energy/time) returned is of negligible value, while the bi-directional rectifier circuit (102) is as expensive as the motor drive circuitry itself (and also typically doubles the size and weight of the motor drive electronics 102-104). As a result of these drawbacks, this method is seldom employed.

Figure 2:
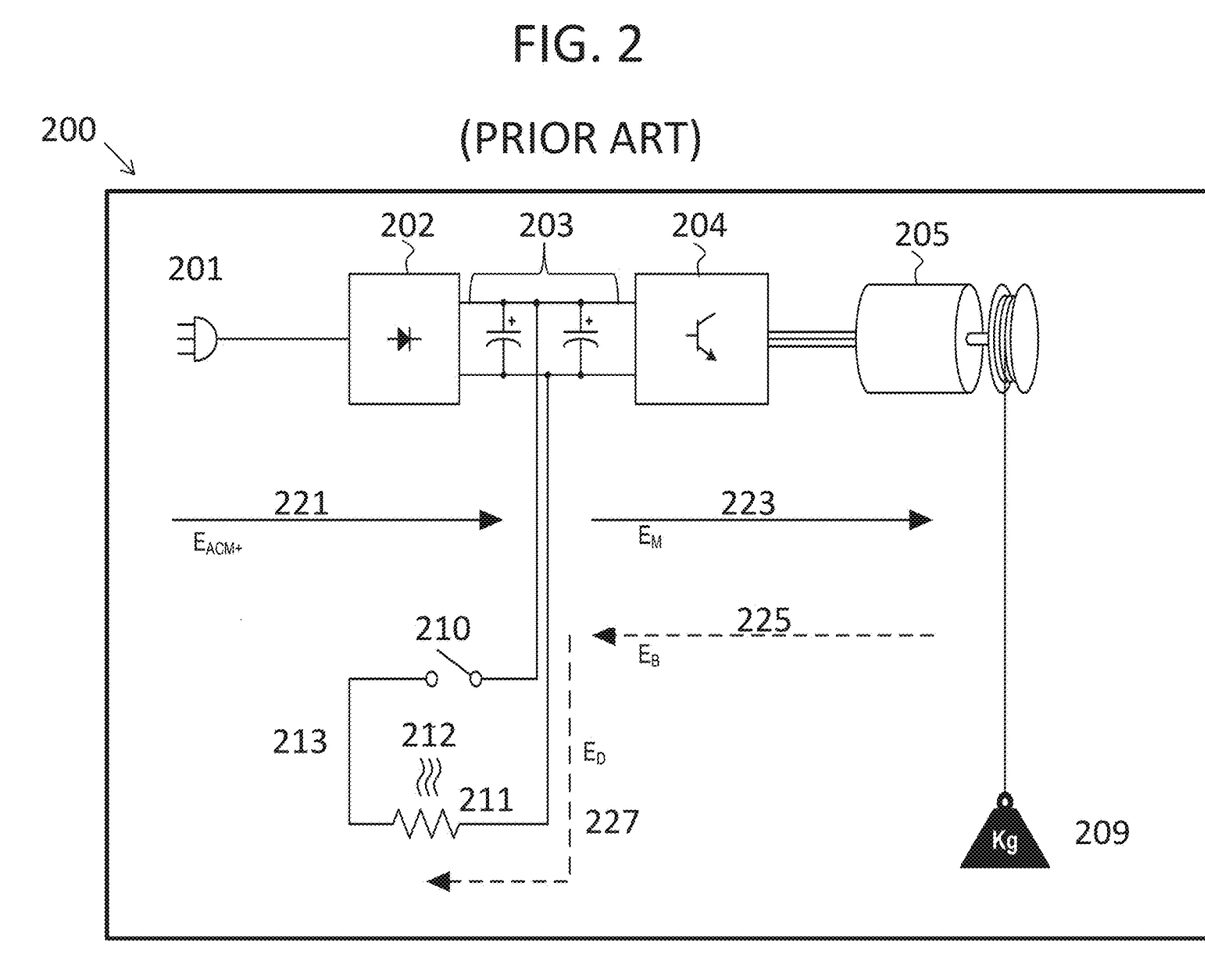
FIG. 2 illustrates another conventional AC line motor drive circuit that limits voltage across a capacitor bank that includes a dissipative load.

The third method to limit the voltage across a capacitor bank is illustrated in FIG. 2. Here the method to limit a capacitor bank (203) voltage is performed by channeling energy into a resistive load (213) and thus converting the energy to waste heat (212) (dissipated) via a resistor (211). First a rectifier (202) fills the capacitor bank (203) with energy from an AC line (201) when motoring (raising; transferring; moving, etc.) a load (209) (see $E_{ACM+}$ energy flow arrow 221). The energy flows to a motor (205) from the capacitor bank (203) via an inverter (204) while motoring the load (209) drains the capacitor bank (203) (see $E_M$ energy flow arrow 223). When the load (209) is being decelerated, lowered (or breaking movement thereof), energy flow from the motor (205) fills the capacitor bank (203) through the inverter (204) (see energy flow arrow 225). Finally, while decelerating/braking/lowering the load (209) the energy flows from the capacitor bank (203) to the resistive load (213) (see energy flow arrow 227) while heating up a resistor (211), which dissipates the energy as heat (212). The resistive load (213) is generally operated by a switch (210) in order to control when limiting the voltage across the capacitor bank (203) is performed. This method is relatively inexpensive, but adds complexity to such a system (200), especially in managing the hazard of heat movement and potentially high temperatures. Despite this method's drawbacks, the resistive conversion to waste heat (212) is the most popular method used to manage the capacitor bank voltage (203) in electronic motor drives which are affected by regenerated energy.

DESCRIPTION OF RELATED ART

U.S. Pat. No. 4,857,818A is directed to an electric motor brake, U.S. Pat. No. 4,395,670A is directed to a hybrid electrical braking method and system for tool equipment having induction motor drives, and U.S. Pat. No. 4,612,490A is directed to a method and system of braking and an asynchronous motor, which all describe DC injection braking of an induction motor, which dissipate energy in the motor. However, these induction types of motors do not have permanent magnets and require specific techniques and components directed to induction motors.

The following websites discuss DC injection into an AC electric motor to slow down or brake the AC electric motor:
1. https://en.wikipedia.org/wiki/DC_injection_braking—discusses DC injection to slow/brake an AC electric motor;
2. http://electrical-engineering-portal.com/methods-braking-motor—discussed DC injection to brake an AC motor;
3. https://www.electrotechnik.net/2015/06/braking-methods-in-induction-motors.html—discusses braking induction motors; and
4. https://www.controleng.com/single-article/dc-injection-lets-motors-do-the-braking/0e70a7d365ab08349a488820274cec67.html.
5. https://en.wikipedia.org/wiki/Vector_control_(motor) is a general description of vector control and field oriented control with examples as applied to induction motors.

However, none of the above cited websites address dissipation of heat or the dissipation of heat through a DC permanent magnetic motor.
6. Texas Instruments SPRABZ2 Sensorless Field Oriented Control of 3-Phase Permanent Magnet Synchronous Motors, which describes the field oriented control technique as applied to permanent magnet motors.

SUMMARY OF THE INVENTION

The foregoing and/or other features and utilities of the present inventive concept can be achieved by providing an electronic motor drive device to dissipate recovered energy from a mechanical load within a connected motor during braking, the device comprising: a DC energy storage device to store and supply power received from an AC power line; an inverter to receive the power from the DC energy storage device and to provide a multi-phase power to the motor; a controller to detect and transform values of currents of the multi-phase power provided to the motor into a first new current ($I_D$) and a second new current ($I_Q$) corresponding to a rotor angle of the motor, $I_D$ producing only motor energy losses and $I_Q$ being directly proportional to the motor's shaft torque; and an energy dissipation controller to monitor the voltage across the capacitor bank ($V_{bus}$) and to control the controller to add $I_D$ to the currents of the multi-phase power based on the value of the monitored $V_{bus}$.

In an example embodiment, the energy dissipation controller can be configured to compare ($V_{bus}$) with a voltage limit ($V_{lim}$) of the DC energy storage device and to compare ($V_{bus}$) with a predetermined lower voltage set point lower than ($V_{lim}$), and to control the controller to add $I_D$ to the currents of the multi-phase power when ($V_{bus}$) exceeds ($V_{lim}$) and to stop adding $I_D$ to the currents of the multi-phase power when the ($V_{bus}$) is less than the predetermined lower voltage set point.

In another example embodiment, the energy dissipation controller can set a first target current ($I_{DT}$) to a non-zero value when ($V_{bus}$) exceeds limit ($V_{lim}$), and sets $I_{DT}$ to zero when ($V_{bus}$) drops below the predetermined lower voltage set point, and controls the controller to add an amount of energy loss current equal to $I_D$ subtracted from $I_{DT}$.

In still another example embodiment, the predetermined lower voltage set point can be below ($V_{lim}$).

In still another example embodiment, the energy dissipation controller sets $I_{DT}$ to a current value proportional to the square root of the product of the motor shaft velocity estimate and $I_Q$.

In yet another example embodiment, the proportionality of $I_{DT}$ to the square root of the product of the motor shaft velocity estimate and $I_Q$ can be adjusted for proper balance based upon the motor's electromagnetic parameters.

In yet another example embodiment, $I_D$ is proportional to the magnetic field that is aligned with the rotor's permanent magnet field and $I_Q$ is proportional to the magnetic field that is perpendicular to the rotor's permanent magnetic field.

In yet another example embodiment, the controller can include: a direct-quadrature-zero transform to de-rotate the calculated $I_D$ and $I_Q$ currents; a summing circuit to subtract the de-rotated $I_D$ from the $I_{DT}$; an independent proportional-integral controller to receive the subtracted de-rotated $I_D$ from the $I_{DT}$ to control this subtracted current based on modulated values of $V_D$ determined from $I_D$; and a negative direct-quadrature-zero transform to rotate $V_D$ to form new three-phase power to be fed to the inverter.

In yet another example embodiment, the controller can be a field oriented controller.

In yet another example embodiment, the DC energy storage device can be a capacitor bank.

The foregoing and/or other features and utilities of the present inventive concept can also be achieved by providing a method of dissipating recovered energy from a mechanical load within a connected motor during braking, the method comprising: storing power received from an AC power line in a DC energy storage device; inverting the stored DC power to a multi-phase power and providing the multi-phase power to the motor; calculating a first new current ($I_D$) and a second new current ($I_Q$) corresponding to a rotor angle of the motor from values of currents of the multi-phase power being provided to the motor and the rotor's angle (position), $I_D$ producing only motor energy losses and $I_Q$ being directly proportional to the motor's shaft torque; and monitoring the voltage across the DC energy storage device ($V_{bus}$) and adding $I_D$ to the currents of the multi-phase power based on the monitored value of $V_{bus}$.

In an example embodiment, the method may further include: comparing $V_{bus}$ with a voltage limit $V_{lim}$ of the DC energy storage device; comparing $V_{bus}$ to with a predetermined lower voltage set point lower than $V_{lim}$; adding $I_D$ to the currents of the multi-phase power when $V_{bus}$ exceeds $V_{lim}$; and preventing $I_D$ from being added to the currents of the multi-phase power when $V_{bus}$ is less than the predetermined lower voltage set point.

In another example embodiment, the method may further include: setting a first target current ($I_{DT}$) to a non-zero value when $V_{bus}$ exceeds $V_{lim}$; setting $I_{DT}$ to zero when $V_{bus}$ drops below the predetermined lower voltage set point; and adding an amount of $I_{DT}$ current to the currents of the multi-phase power to balance energy returned from the motor to the DC power storage device and energy flow from the DC power storage device to the motor as dissipated energy.

In still another example embodiment, the predetermined lower voltage set point can be equal to $h_{lim}$ subtracted from $V_{lim}$.

In still another example embodiment, the method may further include: setting $I_{DT}$ to a current value proportional to the square root of the product of the motor shaft velocity estimate and $I_Q$.

In yet another example embodiment, the proportionality of $I_{DT}$ to the square root of the product of the motor shaft velocity estimate and $I_Q$ can be adjusted for proper balance based upon the motor's electromagnetic parameters.

In yet another example embodiment, the method may further include adding first and second new voltages $V_D$ and $V_Q$ obtained from $I_D$ and $I_Q$ to modulate the DC stored power being converted based on a comparison of the first current with a received first target current and the second current with a received second target current.

In still another example embodiment, the method may further include generating $I_{DT}$ by: comparing $V_{bus}$ to $V_{lim}$; comparing $V_{bus}$ with a predetermined lower voltage value less than $V_{lim}$; and setting $I_{DT}$ to a non-zero value when $V_{bus}$ exceeds $V_{lim}$, otherwise setting $I_{DT}$ to zero when $V_{bus}$ is less than the predetermined lower voltage value.

In still another example embodiment, $I_D$ is proportional to the magnetic field that is aligned with the rotor's permanent magnet field and $I_Q$ is proportional to the magnetic field that is perpendicular to the rotor's permanent magnetic field.

In yet another example embodiment, the method may further include: de-rotating the calculated $I_D$ and $I_Q$ currents; subtracting the de-rotated $I_D$ current from $I_{DT}$; controlling the subtracted current based on modulated values of $V_D$; and rotating the $V_D$ values to the stored DC power before being inverted to a multi-phase power.

The foregoing and/or other features and utilities of the present inventive concept can also be achieved by providing an energy dissipation control circuit to dissipate energy stored in a DC storage device within a motor drive circuit, comprising: a sensor to monitor a capacitor bank voltage ($V_{bus}$) value within the motor drive circuit; a first comparator to compare the $V_{bus}$ to a voltage maximum limit ($V_{lim}$) of the DC storage device; a second comparator to compare the $V_{bus}$ to a predetermined voltage value below the $V_{lim}$; and a controller to provide a controlled a target output current dissipation value to the motor drive circuit based on the monitored $V_{bus}$ value.

In an example embodiment, the target output current dissipation value is set to a predetermined non-zero value when the first comparator value is high, and the target output current dissipation value is set to zero when the second comparator value is high.

In still another example embodiment, the controlled target output current dissipation value is dissipated through a motor.

DETAILED DESCRIPTION OF THE INVENTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Definitions:

$E_M$ is energy supplied to the motor during motoring.
$E_B$ is energy returned from the motor during braking.
$E_D$ is dissipated energy.
$E_{ACM+}$ is energy supplied by the AC line source.
$E_{ACM-}$ is energy provided back to the AC line source.
$V_B$ is voltage detected across an energy storage device.

Figure 3:
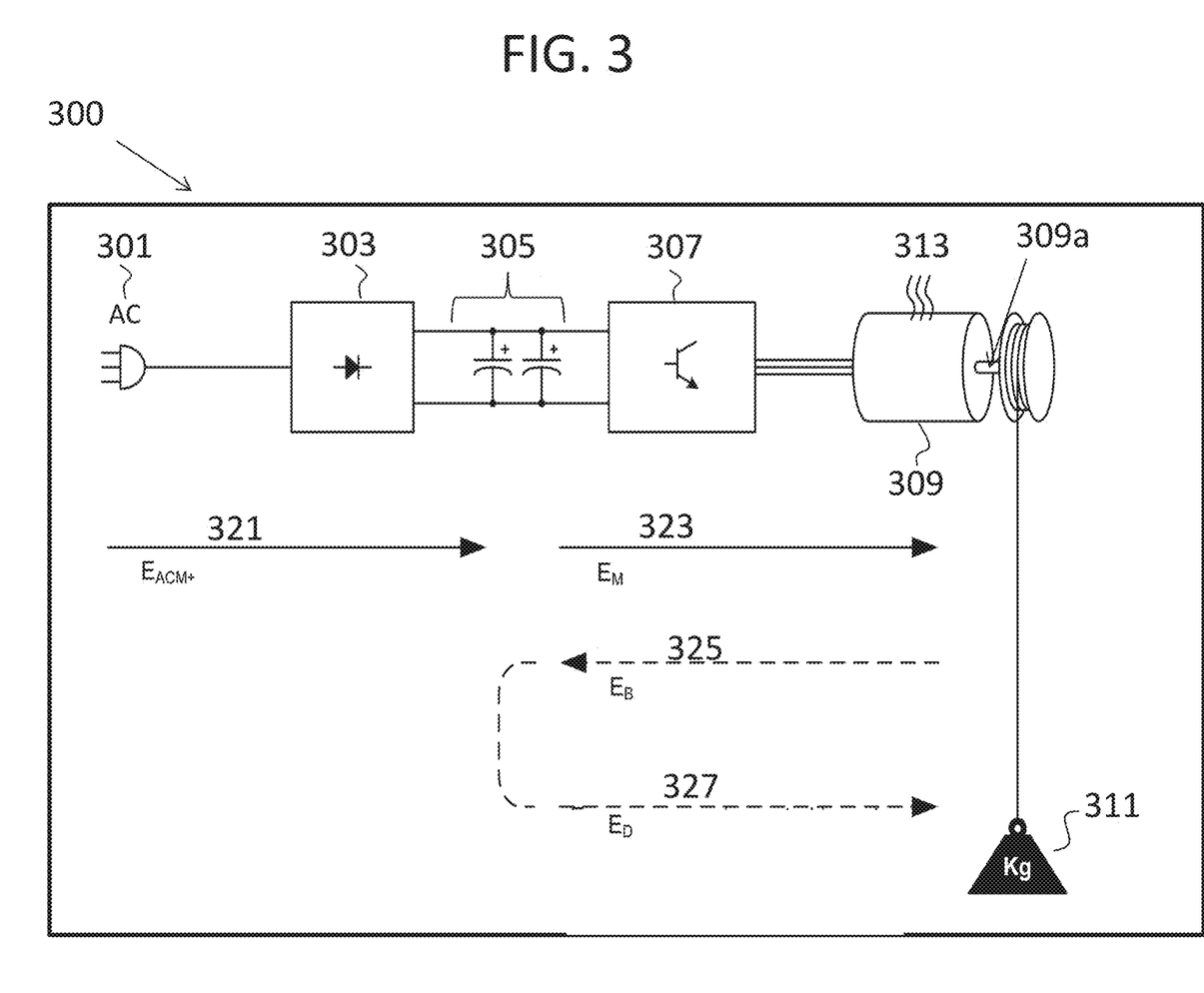
FIG. 3 illustrates energy flow according to example embodiments of the present inventive concept.

FIG. 3 illustrates an overall flow of energy according to example embodiments of the present inventive concept, within an electronic motor drive system (300). It is to be noted that the overall flow of energy according to example embodiments of the present inventive concept is not limited to the electronic motor drive system 300 of FIG. 3, but can be applied to various other electronic motor drive system designs.

The general inventive concept includes an apparatus and method to discharge a capacitor bank (305) in the electronic motor drive system (300) by draining energy from the capacitor bank (305) into windings of a motor (309) simultaneously with an undisturbed desired motion of a shaft (309a) of the motor (309). The energy in the capacitor bank (305) can first be received from an AC power line (301) through a rectifier (303) (see $E_{ACM+}$ energy flow arrow 321). When required, the motor drive system (300) can calculate a set of motor winding phase currents (described in detail below with reference to FIGS. 4 through 8) which will heat the motor windings while at the same time delivering "zero net torque" to the motor shaft (309a). The effect of these "zero net torque" phase currents are used to dissipate energy in the windings of the motor (309) as wasted heat (313) while minimizing any disturbance of the velocity or position of the motor shaft (309a). This energy provided to the motor (309) with the intention to be dissipated via heat (313) can be supplied by the capacitor bank (305) of the motor drive system (300) through an inverter (307), which is described in more detail below. During normal operation of the motor drive circuit (300) the capacitor bank (305) provides the energy converted by the rectifier (303) to the motor (309) via an inverter (307) to drive a load (311) (see $E_M$ energy flow arrow 323). As the motor (309) is braking or lowering the load (311), energy is returned to the capacitor bank (305) (see $E_B$ energy flow arrow 325). Using energy dissipation controller circuits according to example embodiments of the present inventive concept, the energy in the capacitor bank (305) can be returned to the motor (309) (see $E_D$ energy flow arrow 327) in a transformed state (i.e., zero net torque) when these energy dissipation controller circuits according to example embodiments herein detect that the voltage within the capacitor bank (305) approaches or reaches a voltage limit on the capacitor buses in the capacitor bank (305).

Figure 4A:
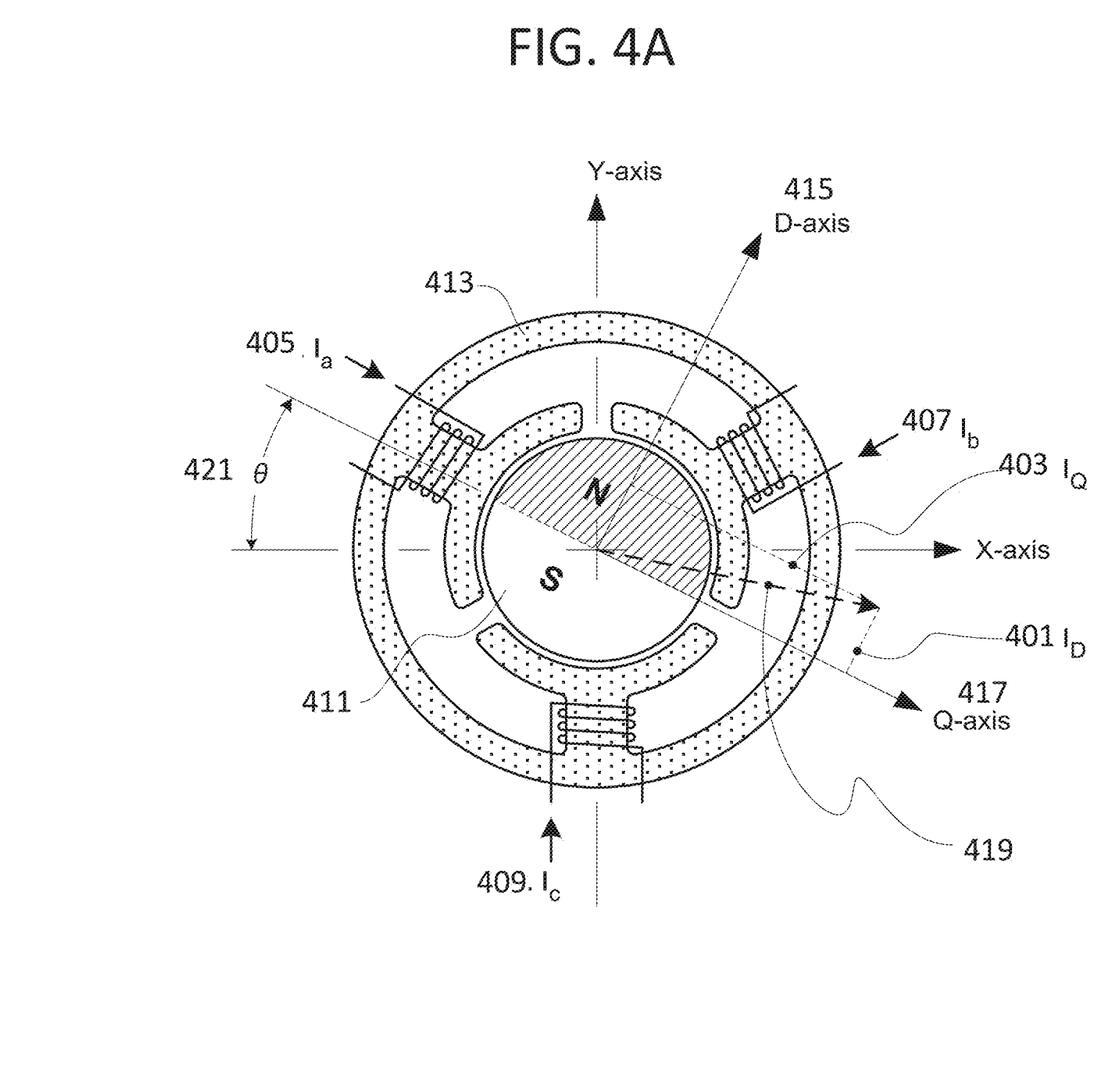
FIG. 4A illustrates a cross-section of an example PM motor showing a D-Q reference frame in which example embodiments of the present inventive concept are applied.

More specifically, the heating of the motor windings by the "zero net torque" phase currents represent an $E_D$ energy flow (327) from the capacitor bank (305) within the motor drive system (300) to wasted heat (313) (heat dissipation) in the motor (309). These target zero net torque currents are added to the motor phase currents required to produce a required shaft (309a) torque, and the combined resulting currents are delivered to the motor phases (see FIG. 4) through the inverter (307). The "zero net torque" phase currents are not applied under motoring conditions or during light braking conditions. However, when motor braking is sufficient to raise the voltage of the internal capacitor bank (305) above a voltage limit $V_{Lim}$, the zero net torque currents are applied to the normal phase currents to cause energy flow from the capacitor bank (305) to the motor (309) windings (see $E_D$ energy flow arrow 327), thus draining the capacitor bank (305) charge as required to limit the voltage across the capacitor bank (305), effectively balancing the $E_B$ energy flow (325) into the capacitor bank (305) as a result of braking the motor's load (311). In other words, the flow of energy to the capacitor bank (305) (energy flow arrow 325) and the flow of energy to the motor (309) for heat dissipation (313) ($E_D$ energy flow arrow 327) occur simultaneously, balanced to maintain the energy in the capacitor bank (305) at a safe level.

Although this method does decrease the continuous capacity of the motor (309) by raising the motor's temperature, this is often an acceptable trade-off for the reduced complexity and costs compared to the conventional methods, especially when the regenerated energy is sporadic or at a low duty cycle, which is typical. This technique requires no more power switching devices or other power components in a typical motor drive circuit than are already required for normal operation, and therefore these devices and methods according to example embodiments of the present inventive concept can be implemented while only augmenting the internal controls, adding little to no cost.

FIG. 4 illustrates an example of a permanent magnet synchronous motor (400) known as a three-phase, three tooth, two pole surface magnet machine. However, as pointed out in more detail below, the present inventive concept is applicable to any construction of a permanent magnet machine. In the three-phase motor of FIG. 4A, phase currents can be separated into two types: 1) phase currents that produce shaft torque and 2) phase currents that do not produce shaft torque, i.e., phase currents that only waste energy. FIG. 4 also illustrates how these phase currents interact with a permanent magnet rotor (411) to produce torque in a simple 3-phase, 3-slot stator (413) 2-pole magnetic rotor (411). The physics and mathematics of the coordinate transformations are the same for other permanent magnet motor constructions, such as for example permanent magnet motors with greater slot counts, greater pole counts and any number of phases.

Through the use of the DQØ (direct-quadrature-zero) transform (proposed by Robert Park in 1929) modern controlled vector motor drives can transform measured phase currents $I_a$, $I_b$ and $I_c$ (405), (407), and (409) into calculated currents with reference to the rotor (i.e., magnetic rotor 411). The transform can be used to de-rotate reference frames of ac waveforms such that they become dc signals. Simplified calculations can then be carried out on these dc signals before performing the inverse transform to recover the actual three-phase ac results.

These transformed currents are referred to as $I_D$ (401) and $I_Q$ (403). Current $I_D$ is proportional to the magnetic field that is aligned with the rotor's permanent magnetic field (N-S) along a D-axis (415). This current $I_D$ produces no shaft torque, but rather only motor losses. Current $I_Q$ is proportional to the magnetic field that is perpendicular to the rotor's (411) permanent magnetic field (⊥N-S) along the Q-Axis (417). This current $I_Q$ is directly proportional to shaft torque in a permanent magnet motor. Accordingly, within a motor drive system, such as, for example the motor drive system 300 illustrated in FIG. 3, control devices and methods according to example embodiments of the present inventive concept seek to monitor and control the $I_D$ and $I_Q$ currents. The DQØ transformation calculations are well known in the art and therefore will not be laid out here in order to maintain brevity of the detailed description. However, it is pointed out that regarding the DQØ transformation, for balanced three-phase windings the DQØ transformation is defined as follows:

$$I_D = \frac{2}{3}[I_a \sin(\theta) + I_b \sin(\theta - \pi \cdot 2/3) + I_c \sin(\theta + \pi \cdot 2/3)]$$

$$I_Q = \frac{2}{3}[I_a \cos(\theta) + I_b \cos(\theta - \pi \cdot 2/3) + I_c \cos(\theta + \pi \cdot 2/3)]$$

Various methods can be used control the $I_D$ and $I_Q$ currents within a motor (i.e., motor 309).

It is to be noted that although a three-phase winding motor (309) as illustrated in FIG. 4A is referenced throughout the specification for simplicity, the present inventive concept can be applied to any construction of a permanent magnet machine where the magnets move and the stator is fixed, including inside out constructions where magnets/rotor are on the outside and the stator is in the center (where the rotor is still the moving part). The present inventive concept can also be applied to linear motors that have "unrolled" constructions, i.e., constructed along a line, where the moving part is then known as the forcer instead of a rotor. The present inventive concept can also be applied to motors with "toothless" stators where the stator is just a shell, known as "ironless" motors. The inventive concept can also be applied to any permanent magnet motor without a commutator/brush assembly that can be approximated by the D-Q model illustrated and described in detail with reference to FIG. 4A.

Several applications of the inventive concept can be with, for example robots, Pick and Place mechanisms, automatic guided vehicles, locomotives, elevators, wheelchairs, automobiles, cutting machines, printers, conveyers, etc.

Figure 4B:
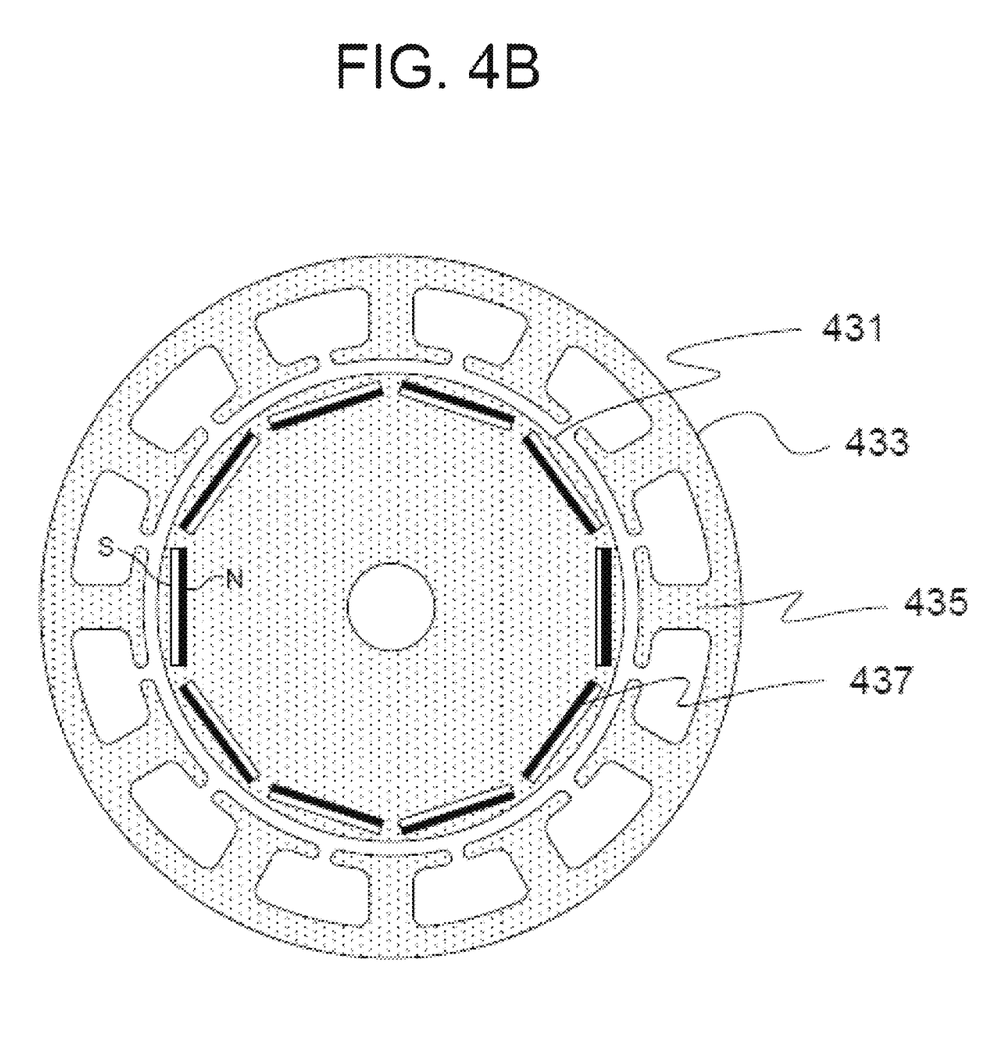
FIG. 4B illustrates a cross-section of another example PM motor in which a D-Q reference according to example embodiments of the present inventive concept can also be applied.

FIG. 4B illustrates another example permanent magnet motor construction in which the present inventive concept as described herein can be applied. The motor of FIG. 4B illustrates a twelve tooth, ten magnetic pole motor design know as an "interior permanent magnet (IPM) machine. Illustrated in FIG. 4B is a rotor 431, a stator 433, a stator tooth 435 and an interior (embedded) permanent magnet 437. Another motor, among many, in which present inventive concept can be applied is, for example an eighteen tooth, eight pole surface magnet motor. However, for simplicity of explanation of the overall inventive concept, the detailed description below will refer to the simple three-phase motor illustrated in FIG. 4A.

Figure 5:
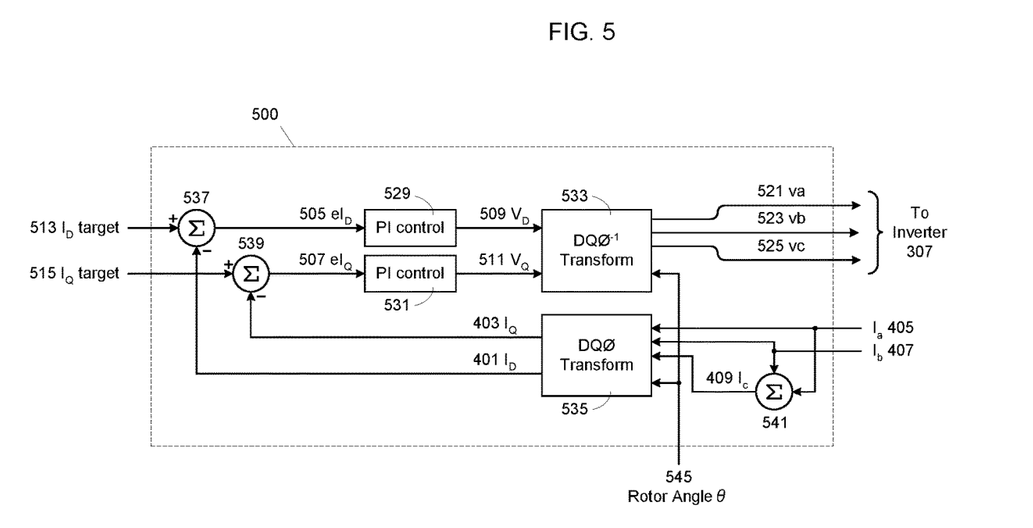
FIG. 5 illustrates an Field oriented D, Q controller according to an example embodiment of the present inventive concept.

FIG. 5 illustrates an Indirect Vector Voltage Rotator D, Q controller (500) according to an example embodiment, as it is implemented to perform the operations of the motor drive circuit (300) of FIG. 3 with reference to FIG. 6, as described below. This Field oriented D, Q controller (500) modulates calculated $V_D$ (509) and $V_Q$ (511) voltages in order to control output $I_D$ (401) and $I_Q$ (403) currents using independent proportional-integral controllers (529) and (531) fed by the calculated $I_D$ and $I_Q$ currents (401) and (403), respectively. More specifically, the controllers (529) and (531) continuously control an output based on the error values $eI_D$ and $eI_Q$ determined by the difference between a target $I_D$ and target $I_Q$ and the measured $I_D$ and $I_Q$. Before the $I_D$ (401) and $I_Q$ (403) currents are fed to the independent proportional-integral controllers (529) and (531), respectively, they are formed by de-rotating (using a DQØ transform (535)) the $I_a$, $I_b$ and $I_c$ currents read from the output of the inverter (i.e., 307) using the direct-quadrature-zero transform process as described with reference to FIG. 4. After the $I_D$ and $I_Q$ currents are adjusted to control a new output via the $eI_D$ and $eI_Q$ values and the independent proportional-integral controllers (529) and (531), respectively, the output can be provided as control values $V_D$ and $V_Q$. The $V_D$ and $V_Q$ (509) and (511) values are rotated using a DQØ$^{-1}$ transform (533) to calculate controlled $v_a$, $v_b$ and $v_c$ voltages (521), (523) and (525) to be fed back to the inverter (307).

In a permanent magnet motor such as the one illustrated in FIG. 4A (see also FIG. 3, motor 309), the $I_D$ current (401) can be controlled to a target of zero (0) for maximum efficiency under normal motoring and light braking conditions. The target for the current $I_Q$ (403) can be set to non-zero values proportional to the required torque based upon the desired acceleration, velocity and position of the motor's shaft (not illustrated to provide brevity of the disclosure). Thus, energy can be supplied to a motor (i.e., motor 309) with maximum efficiency.

Under heavy braking conditions of such a motor, which deposits enough energy back across the DC energy storage device (305) (see $E_B$ energy flow arrow 325 in FIG. 3) to raise the DC energy storage device (305) voltage above a safe limit threshold, the motor drive circuit 500 according to an example embodiment of the present inventive concept, can control the $I_D$ current (401) to be a non-zero value in order to dissipate the DC energy storage device 305 energy into the motor's phase windings. Although the $I_D$ current (401) dissipates the DC energy storage device (305) energy into the motor (309) windings to limit the DC energy storage device (305) voltage, this $I_D$ current (401) has no influence on the motion of the motor shaft (309a), as described above. However the $I_Q$ current (403) that dissipates/charges the DC energy storage device (305) as it changes the energy into/out of the motor (309) windings does have an influence on the motor (309) shaft's motion, also as described above. A more detailed description of the $I_D$ target and the $I_Q$ target calculation devices and methods according to example embodiments of the present inventive concept are described below with reference to FIG. 6.

Figure 6:
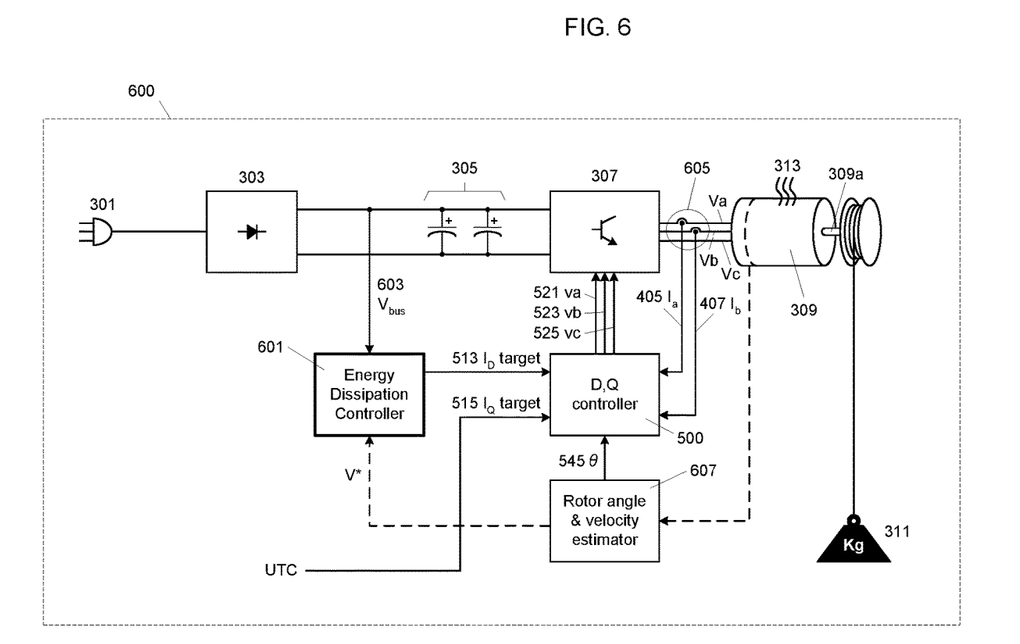
FIG. 6 illustrates an Energy dissipation controller added to a motor drive to practice the invention

FIG. 6 illustrates a vector controlled permanent magnet motor drive system 600 to limit the level of regenerated energy stored in its DC energy storage device (305), according to example embodiments of the present inventive concept, as described in detail below. It is to be noted that the present inventive concept applies to other DC energy storage devices, such as, for example a capacitor bank, and other similar DC storage devices used with a drive circuit that uses stored energy.

Referring to FIG. 6, an Energy Dissipation Controller (601) monitors a voltage $V_{bus}$ (603) across the DC energy storage device (305), and when the voltage $V_{b15}$ (603) exceeds a maximum limit the Energy Dissipation Controller (601) can set an $I_D$ current target (513) value from a value of zero (0) to a predetermined non-zero value in order to effectively dissipate energy from the DC energy storage device (305) to the motor (309).

More specifically, the Energy Dissipation Controller (601) provides current $I_D$ target; the $I_Q$ target being supplied by user torque command (UTC) to the Field oriented D, Q controller (500) to be used to determine a difference between the measured $I_D$ and $I_Q$ currents and the $I_D$ target and $I_Q$ target currents set to protect the DC energy storage device (305) or other power storage device from exceeding its maximum voltage storage limit.

As described above with reference to FIG. 5, the $I_D$ and $I_Q$ currents are calculated from the motor phase currents $I_a$ (405), $I_b$ (407), and $I_c$ (409) received by the DQØ transform (535). The $I_D$ and $I_Q$ currents can be compared with set $I_D$ target and $I_Q$ target currents provided by the Energy Dissipation Controller (601) according to example embodiments of the present inventive concept, to determine the desired $I_D$ and $I_Q$ output currents. As pointed out above with reference to FIG. 5, the desired $I_D$ and $I_Q$ output currents can be used to calculate new $V_D$ and $V_Q$ values, which can then be rotated by the $DQ\emptyset^{-1}$ transform (533) to calculate controlled voltages va, (521), vb (523), and vc (525) to be fed to the inverter (307).

The resulting adjusted phase currents $I_a$ (405), $I_b$ (407) and $I_c$ (409) from the controlled voltages $v_a$, (521), $v_b$ (523), and $v_c$ (525) do not disturb the motion of the motor load (311), but do cause energy to flow from the DC energy storage device (305) to the motor (309) as dissipated waste heat (313), as previously illustrated in FIG. 3. The motion of the motor load (311) is not disturbed because, as described above with reference to FIG. 4, the calculated $I_D$ current (401) is proportional to the magnetic field that is aligned with the rotor's permanent magnetic field (N-S) along the D-axis, and therefore produces no shaft torque, but only motor losses.

Also included in FIG. 6 is a rotor angle and velocity estimator 607 which estimates the rotor angle and velocity of the motor 309 and provides the rotor angle θ (545) to the Field oriented D, Q controller (500) while providing the velocity estimate (v*) to the energy dissipation controller (601). A user torque command (UTC) can be used to provide the $I_Q$ target 515 to the Field oriented D, Q controller (500).

Figure 7:
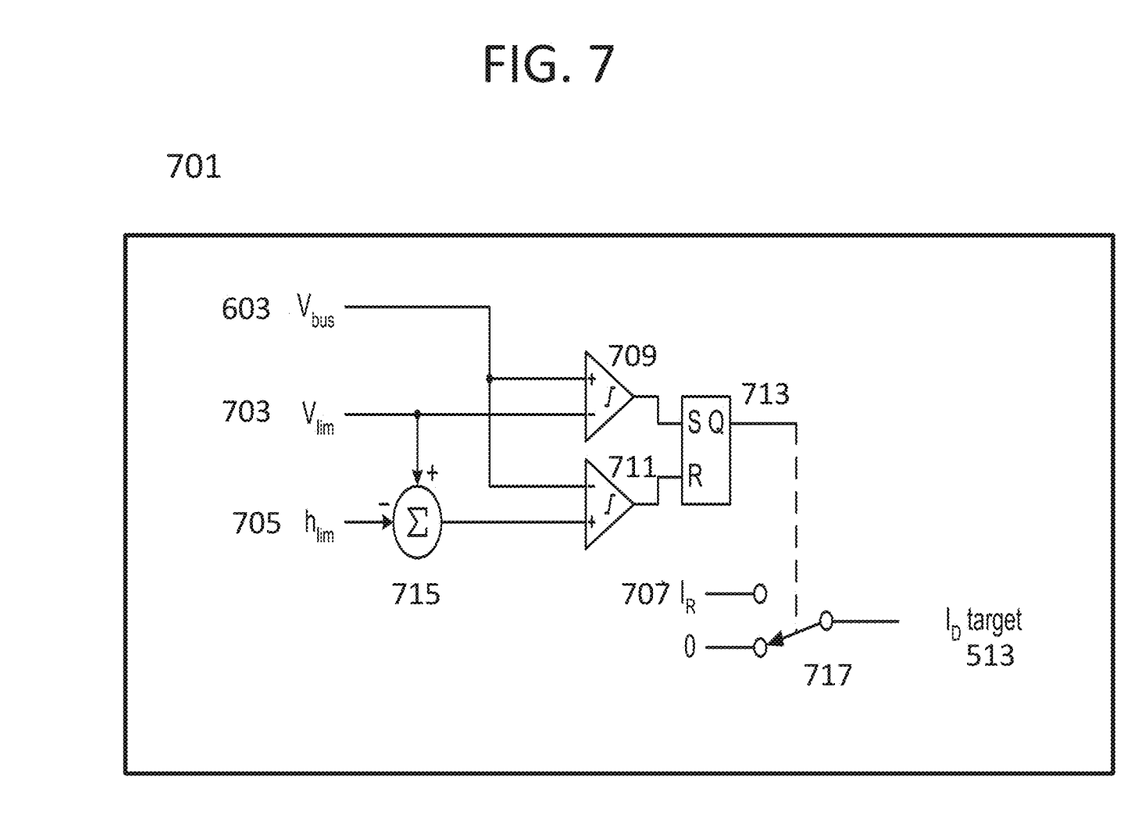
FIG. 7 illustrates a Hysteric Energy Dissipation Controller according to an example embodiment of the present inventive concept.
Figure 8:
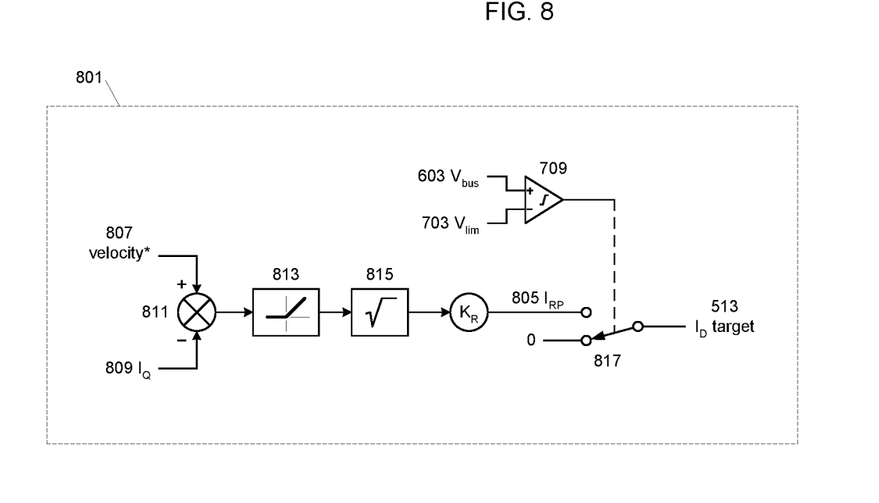
FIG. 8 illustrates a Power Balancing Energy Dissipation Controller according to an example embodiment of the present inventive concept.

The energy dissipation controller (601) according to example embodiments of the present inventive concept can use various methods which perform the intended purposes as described herein, i.e., to continuously set/command the $I_D$ target current (513). FIGS. 7 and 8 illustrate two example energy dissipation controllers according to example embodiments of the present inventive concept.

FIG. 7 illustrates an energy dissipation controller circuit 701 according to an example embodiment of the present inventive concept, as applied to the motor drive circuit of FIG. 6. Here, when the voltage $V_{bus}$ (603) across the DC energy storage device (305) (see FIG. 6) exceeds a voltage limit $V_{lim}$ (703), the $I_D$ target current (513) is set to a fixed non-zero value $I_R$ (707). This can be accomplished by inputting both the $V_{bus}$ (603) value and a $V_{lim}$ (703) into a comparator (709) such that the output value is low until the $V_{bus}$ (603) across the DC energy storage device (305) exceeds the voltage limit $V_{lim}$(703) referred to here as proportionality constant $K_R$, at which point the output becomes high.

When the voltage $V_{bus}$ (603) across the DC energy storage device 305 later drops below a lower set point [$V_{lim}$ (703)−$h_{lim}$ (705)] the $I_D$ target current (513) is reset to a zero value as illustrated by a switch (717). The lower set point [$V_{lim}$ (703)−$h_{lim}$ (705)] can be obtained using a summation component (715). This can be accomplished by inputting both the $V_{bus}$ (603) value and the lower set point $h_{lim}$ (705) into a comparator 711 such that the output value is low until the $V_{bus}$ (603) across the DC energy storage device (305) drops below [$V_{lim}$ (703)−$h_{lim}$ (705)], at which point the output of comparator 711 becomes high, switching the $I_D$ target current (513) back to a zero value. The outputs of comparators 709 and 711 can be fed into a basic S-R latch circuit 713 to create the switching effect. However, alternative components that perform the intended operations as described herein can be used.

During heavy braking $I_D$ then limit cycles, balancing the energy flow from the braking load with the dissipation in the motor to keep the capacitor bank voltage below $V_{lim}$. It is to be noted that the energy dissipation controller (701) of FIG. 7 is not limited to the illustrated circuit design and components, but can use any alternative arrangement of circuit components that provide the intended operations of controlling energy dissipation of a motor as described herein.

FIG. 8 illustrates an energy dissipation controller (801) according to another example embodiment of the present inventive concept, as applied to the motor drive circuit of FIG. 6. Here, the controller (801) operates to balance a reverse power flow into the motor (309) with the power dissipated as resistive heating (313) of the motor windings. The controller circuit (801) and method thereof in this example embodiment tends to disturb the shaft (309a) motion even less than the controller circuit (701) and method as illustrated in FIG. 7 when the measurement or estimate of a rotor angle (545) of the motor (309) includes inaccuracies.

More specifically, the power returned into the motor (309) from braking the load (311) is proportional to the product of the shaft velocity (807) x shaft torque (809), where the shaft torque (809) is proportional to the $I_Q$ current, as pointed out above. Therefore, as illustrated in FIG. 8, the shaft velocity (807) can be multiplied by the $I_Q$ current (809) using a multiplier circuit (811) to estimate the power being returned to the energy storage bank from the motor (309).

The power dissipated in the motor (309) windings by the dissipation controller circuit (801) is proportional to the square of the product of the $I_D$ current and the winding resistance. The dissipation controller circuit (801) calculates a current $I_{RP}$ (805) (a current proportional to the square root (815) of the product of the shaft velocity estimate (807) and a current $I_Q$ (809)) to balance the power flows. The current $I_{RP}$ (805) is calculated to be non-zero only when braking is occurring (when velocity and torque are opposite polarities). When $V_{bus}$ (603) exceeds the limit value $V_{lim}$ (703), i.e. ($V_{bus}$ (603)>$V_{lim}$ (703)), the $I_D$ current target (513) is set to $I_{RP}$ (805), which causes a smooth (continuous) energy flow into the motor (309), thus balancing the energy flow. A proportionality constant $K_R$ (805) is adjusted for proper balance based upon the motor's electromagnetic parameters.

When ($V_{bus}$ (603)<$V_{lim}$ (703)), the $I_D$ current target (513) is set to zero via a switching device (817).

Figure 9:
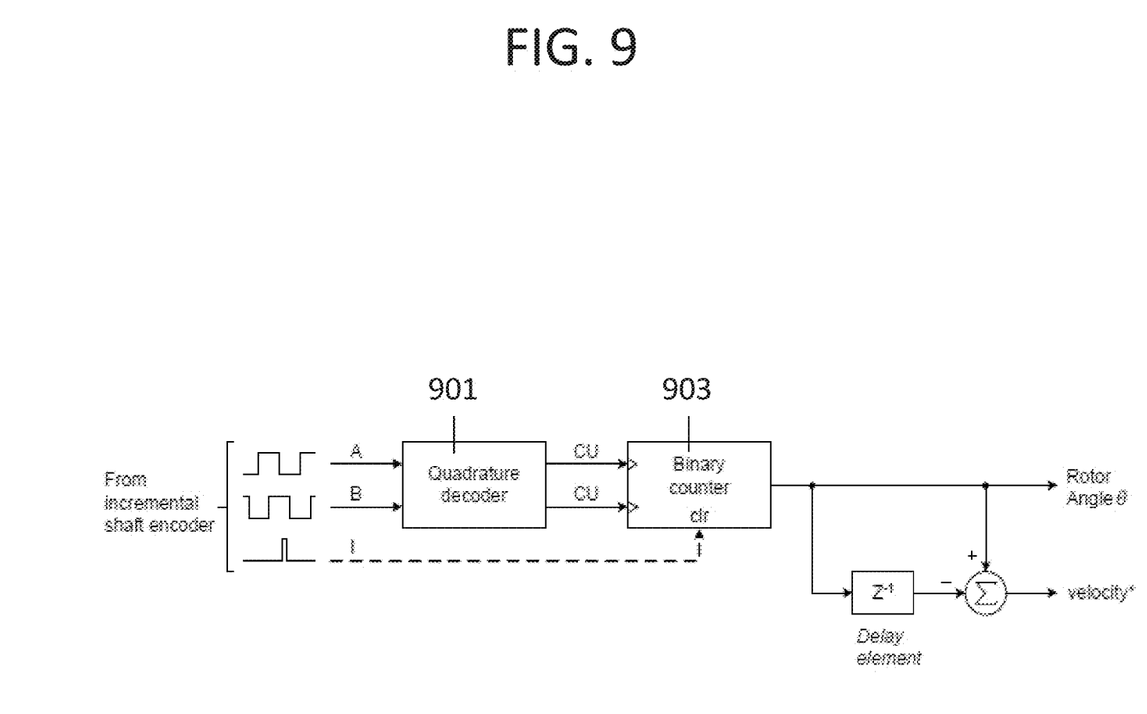
FIG. 9 illustrates a rotor angle and velocity estimator according to an example embodiment of the present inventive concept.

FIG. 9 illustrates an example of a rotor angle & velocity estimator 607 of FIG. 6. Referring to FIG. 9, signals quad A and quad B are provided from an incremental shaft encoder of the motor, as well as an index I. These signals quad A, quad B and Index I are provided to a quadrature decoder 901 which produces output signal for direction and position. A binary counter 903 receives the output signals from the quadrature decoder including the index I, which rolls over every electrical cycle of the motor and produces the rotor angle θ. The estimated velocity can be determined by providing a delay element $Z^{-1}$ to the rotor angle θ and then summing the output of the delay element $Z^{-1}$ with the rotor angle θ to obtain estimated velocity (v*).

The above circuits and methods thereof can be the same when applied to linear motors. Simply substituting "forcer" for "shaft" and "force" for "torque" in the text above will apply with respect to linear motors. Moreover, the present inventive concept can also be the same when applied to permanent magnet linear motors.

Accordingly, it is to be understood that the embodiments of the present inventive concept herein described are merely illustrative of the application of the principles of the present inventive concept. Reference herein to details of the illustrated embodiments is not intended to limit the scope of the claims herein, which themselves will recite those features regarded as essential to the present inventive concept.

What is claimed is:

1. An electronic motor drive device to dissipate recovered energy from a mechanical load within a connected motor during braking, the device comprising:

an energy storage device to store power received from an AC power line and to supply the stored power to operate a connected motor;
an inverter to receive the power from the energy storage device and to provide a multi-phase power to the motor;
a controller to detect and transform values of currents of the multi-phase power provided to the motor into a first new current ($I_D$) and a second new current ($I_Q$) corresponding to a rotor angle of the motor, $I_D$ producing only motor energy losses and $I_Q$ being directly proportional to the motor's shaft torque; and
an energy dissipation controller to monitor the voltage across the energy storage device ($V_{bus}$) and to provide a calculated $I_D$ target current to the controller to increase the $I_D$ current of the multi-phase power, the provided $I_D$ target current being based on the value of the monitored $V_{bus}$.

2. The device according to claim 1, wherein the energy dissipation controller is configured to compare ($V_{bus}$) with a voltage limit ($V_{lim}$) of the energy storage device and to compare ($V_{bus}$) with a predetermined lower voltage set point lower than ($V_{lim}$), and to control the controller to add $I_D$ to the currents of the multi-phase power when ($V_{bus}$) exceeds ($V_{lim}$) and to stop adding $I_D$ to the currents of the multi-phase power when the ($V_{bus}$) is less than the predetermined lower voltage set point.

3. The device according to claim 2, wherein the energy dissipation controller sets a first target current ($I_{DT}$) to a non-zero value when ($V_{bus}$) exceeds limit ($V_{lim}$), and sets $I_{DT}$ to zero when ($V_{bus}$) drops below the predetermined lower voltage set point, and controls the controller to add an amount of energy loss current equal to $I_{DT}$.

4. The device according to claim 2, wherein the predetermined lower voltage set point is below ($V_{lim}$).

5. The device according to claim 2, wherein the energy dissipation controller sets $I_{DT}$ to a current value proportional to the square root of the product of the motor shaft velocity estimate and $I_Q$.

6. The device according to claim 5, wherein the proportionality of $I_{DT}$ to the square root of the product of the motor shaft velocity estimate and $I_Q$ is adjusted for proper balance based upon the motor's electromagnetic parameters.

7. The device according to claim 1, wherein $I_D$ is proportional to the magnetic field that is aligned with the rotor's permanent magnet field and $I_Q$ is proportional to the magnetic field that is perpendicular to the rotor's permanent magnetic field.

8. The device according to claim 3, wherein the controller comprises:
a direct-quadrature-zero transform to de-rotate the calculated $I_D$ and $I_Q$ currents;
a summing circuit to subtract the de-rotated $I_D$ from the $I_{DT}$;
an independent proportional-integral controller to receive the subtracted de-rotated $I_D$ from the $I_{DT}$ to control this subtracted current based on modulated values of $V_D$ determined from $I_D$; and
a negative direct-quadrature-zero transform to rotate $V_D$ to form new three-phase power to be fed to the inverter.

9. The device according to claim 5, wherein the controller comprises:
a direct-quadrature-zero transform to de-rotate the calculated $I_D$ and $I_Q$ currents;
a summing circuit to subtract the de-rotated $I_D$ from the $I_{DT}$;
an independent proportional-integral controller to receive the subtracted de-rotated $I_D$ from the $I_{DT}$ to control this subtracted current based on modulated values of $V_D$ determined from $I_D$; and
a negative direct-quadrature-zero transform to rotate $V_D$ to form new three-phase power to be fed to the inverter.

10. The device according to claim 1, wherein the controller is a field oriented controller.

11. The device according to claim 1, wherein the energy storage device is a capacitor bank.

12. A method of dissipating recovered energy from a mechanical load within a connected motor during braking, the method comprising:
storing power received from an AC power line in a DC power storage device;
inverting the stored DC power to a multi-phase power and providing the multi-phase power to the motor;
calculating an ($I_D$) current corresponding to a rotor angle of the motor from values of currents of the multi-phase power being provided to the motor, the $I_D$ current producing only motor energy losses and $I_Q$ current being directly proportional to the motor's shaft torque;
calculating an $I_D$ target current based on monitoring the voltage across the DC power storage device ($V_{bus}$); and
adding $I_D$ to the currents of the multi-phase power based on the monitored value of $V_{bus}$.

13. The method according to claim 12, further comprising:
comparing $V_{bus}$ with a voltage limit $V_{lim}$ of the DC power storage device;
comparing $V_{bus}$ to with a predetermined lower voltage set point lower than $V_{lim}$;
adding $I_D$ to the currents of the multi-phase power when $V_{bus}$ exceeds $V_{lim}$; and
preventing $I_D$ from being added to the currents of the multi-phase power when $V_{bus}$ is less than the predetermined lower voltage set point.

14. The method according to claim 12, further comprising:
setting a first target current ($I_{DT}$) to a non-zero value when $V_{bus}$ exceeds $V_{lim}$;
setting $I_{DT}$ to zero when $V_{bus}$ drops below the predetermined lower voltage set point; and
adding an amount of $I_{DT}$ current to the currents of the multi-phase power to balance energy returned from the motor to the DC power storage device and energy flow from the DC power storage device to the motor as dissipated energy.

15. The method according to claim 12, wherein the predetermined lower voltage set point is equal to $h_{lim}$ subtracted from $V_{lim}$.

16. The method according to claim 12, further comprising:
setting $I_{DT}$ to a current value proportional to the square root of the product of the motor shaft velocity estimate and $I_Q$.

17. The method according to claim 16, wherein the proportionality of $I_{DT}$ to the square root of the product of the motor shaft velocity estimate and $I_Q$ is adjusted for proper balance based upon the motor's electromagnetic parameters.

18. The method according to claim 12, further comprising:
applying first and second new voltages $V_D$ and $V_Q$ obtained from $I_D$ and $I_Q$ to modulate the DC stored power being converted based on a comparison of the first current with a received first target current and the second current with a received second target current.

19. The method according to claim 14, further comprising:
generating $I_{DT}$ by:
comparing $V_{bus}$ to $V_{lim}$;
comparing $V_{bus}$ with a predetermined lower voltage value less than $V_{lim}$; and
setting $I_{DT}$ to a non-zero value when $V_{bus}$ exceeds $V_{lim}$, otherwise setting $I_{DT}$ to zero when $V_{bus}$ is less than the predetermined lower voltage value.

20. The method according to claim 12, wherein $I_D$ is proportional to the magnetic field that is aligned with the rotor's permanent magnet field and $I_Q$ is proportional to the magnetic field that is perpendicular to the rotor's permanent magnetic field.

21. The method according to claim 14, further comprising:
de-rotating the calculated $I_D$ and $I_Q$ currents;
subtracting the de-rotated $I_D$ current from $I_{DT}$;
controlling the $I_D$ by changing values of $V_D$; and
rotating the $V_D$ values to modulate the stored DC power.

22. An energy dissipation control circuit to dissipate energy stored in a DC storage device within a motor drive circuit, comprising:

a first comparator to continuously monitor and compare a DC storage device voltage ($V_{bus}$) value to a voltage maximum limit ($V_{lim}$) of the DC storage device;
a second comparator to continuously monitor and compare the DC storage device voltage $V_{bus}$ value to a predetermined voltage value below the $V_{lim}$; and
a controller to provide a target output current dissipation value to the motor drive circuit to decrease the $V_{bus}$ value based on the monitored $V_{bus}$ value, the target output current dissipation value being varied depending on the monitored $V_{bus}$ value.

23. The energy dissipation control circuit according to claim 22, wherein the target output current dissipation value is set to a predetermined non-zero value when the first comparator value is high, and the target output current dissipation value is set to zero when the second comparator value is high.

24. The energy dissipation control circuit according to claim 22, wherein the controlled target output current dissipation value is dissipated through a motor.

* * * * *